US012785385B2

(12) United States Patent
Shu et al.

(10) Patent No.: US 12,785,385 B2
(45) Date of Patent: Nov. 3, 2026

(54) ARC SUPPRESSION METHOD, SYSTEM, AND MEDIUM FOR DISTRIBUTION NETWORK FAULTS BASED ON CLOSED-LOOP SELF-HEALING CONTROL

(71) Applicant: Kunming University of Science and Technology, Kunming City (CN)

(72) Inventors: Hongchun Shu, Kunming City (CN); Jun Dong, Kunming City (CN); Yuan Gao, Kunming City (CN); Yutao Tang, Kunming City (CN); Kaiqing Tian, Kunming City (CN); Zhiheng Yang, Kunming City (CN)

(73) Assignee: Kunming University of Science and Technology (CN)

( * ) Notice: Subject to any disclaimer, the term of this patent is extended or adjusted under 35 U.S.C. 154(b) by 97 days.

(21) Appl. No.: 18/970,978

(22) Filed: Dec. 6, 2024

(65) Prior Publication Data

US 2025/0192547 A1 Jun. 12, 2025

(30) Foreign Application Priority Data

Dec. 12, 2023 (CN) ......................... 202311699314.0

(51) Int. Cl.

| | |
|---|---|
| ***H02H 9/06*** | (2006.01) |
| ***G01R 25/00*** | (2006.01) |
| ***G01R 31/08*** | (2020.01) |
| ***G01R 31/52*** | (2020.01) |
| ***H02H 1/00*** | (2006.01) |
| ***H02H 9/04*** | (2006.01) |
| ***H02H 9/08*** | (2006.01) |

(52) U.S. Cl.
CPC ............. *H02H 9/08* (2013.01); *G01R 25/005* (2013.01); *G01R 31/086* (2013.01); *G01R 31/52* (2020.01); *H02H 1/0015* (2013.01); *H02H 9/045* (2013.01)

(58) Field of Classification Search
CPC ........ H02H 9/08; H02H 9/045; H02H 1/0015; G01R 31/52; G01R 25/005; G01R 31/086
See application file for complete search history.

(56) References Cited

U.S. PATENT DOCUMENTS

| | | | | |
|---|---|---|---|---|
| 10,985,558 B1* | 4/2021 | Jia | ........................ | G05B 19/042 |
| 2014/0139961 A1* | 5/2014 | Mellon, Jr. | .............. | H02H 5/12 361/87 |
| 2020/0326385 A1* | 10/2020 | Liu | .......................... | H02H 7/20 |

* cited by examiner

*Primary Examiner* — Scott Bauer

(57) ABSTRACT

The invention relates to relay protection technology, specifically a method, system, and medium for fault arc suppression in distribution networks using closed-loop self-healing control. When a fault is detected in the distribution network, transient changes in the measured and virtual phase currents of each phase are obtained. The Pearson correlation coefficient between these changes is calculated to identify the target fault phase. The neutral point-to-ground voltage value is retrieved, and the target fault phase's voltage is adjusted to zero based on this value. The current from the fault phase, when its voltage is zeroed, is acquired. An injected current is then compensated at the neutral point to match this value, ensuring both the ground fault current and the fault phase voltage are reduced to zero. This method enhances the applicability of arc suppression for grounding faults in distribution networks.

10 Claims, 5 Drawing Sheets

ARC SUPPRESSION METHOD, SYSTEM, AND MEDIUM FOR DISTRIBUTION NETWORK FAULTS BASED ON CLOSED-LOOP SELF-HEALING CONTROL

TECHNICAL FIELD

The present invention relates to the field of relay protection technology, specifically to an arc suppression method, system, and medium for distribution network faults based on closed-loop self-healing control.

BACKGROUND OF THE INVENTION

In the technical solutions related to arc suppression for grounding faults in distribution networks, methods can be categorized based on the type of control object into voltage-type and current-type arc suppression. Voltage-type arc suppression reduces the fault phase voltage to zero, while current-type arc suppression reduces the fault point current to zero.

Voltage-type arc suppression is generally suitable for high-resistance faults, but it is not effective for low-resistance metallic faults. Conversely, current-type arc suppression is typically effective for low-resistance faults but is not suitable for high-resistance faults.

Due to the limitations of both arc suppression methods under specific fault conditions, there is a need for a method that is applicable to both high-resistance and low-resistance faults. This would enhance the applicability of arc suppression techniques for grounding faults in distribution networks, thereby ensuring the safe and reliable operation of the distribution network.

The above content is intended solely to assist in understanding the technical solutions of the present invention and does not imply acknowledgment of the aforementioned content as prior art.

DESCRIPTION OF THE INVENTION

The main objective of the present invention is to provide a fault arc suppression method for distribution networks based on closed-loop self-healing control, aimed at enhancing the applicability of arc suppression methods for grounding faults in distribution networks.

To achieve this objective, the proposed fault arc suppression method for distribution networks based on closed-loop self-healing control includes the following steps:

Upon detecting a fault in the distribution network, obtain the measured transient changes in phase current for each phase as well as the virtual transient changes in phase current within the distribution network.

Calculate the Pearson correlation coefficient between the measured transient changes in phase current and the virtual transient changes in phase current for each phase, and determine the target fault phase based on this Pearson correlation coefficient.

Acquire the neutral point-to-ground voltage value. Based on this voltage value, adjust the voltage of the target fault phase to bring it to zero.

Obtain the current output of the fault phase when its voltage is brought to zero, and inject a compensating current into the neutral point of the distribution network that matches this current value. This action aims to ensure that both the ground current at the distribution network's grounding point and the voltage of the fault phase are brought to zero.

Optionally, the step of calculating the Pearson correlation coefficient between the measured phase current transient variation for each phase and the virtual phase current transient variation includes:

Calculating the standard deviation corresponding to the measured phase current transient variation for each phase, designated as the first standard deviation;

Calculating the standard deviation corresponding to the virtual phase current transient variation for each phase, designated as the second standard deviation;

Calculating the mean deviation between the measured phase current transient variation and the virtual phase current transient variation for each phase.

Obtain the number of samples;

Select one phase from the set of phases as the target phase, wherein the measured phase current transient variation corresponding to the target phase is designated as the target measured phase current transient variation, and the virtual phase current transient variation corresponding to the target phase is designated as the target virtual phase current transient variation;

Based on the number of samples, the first standard deviation, the second standard deviation, the mean deviation, the target measured phase current transient variation, and the target virtual phase current transient variation, determine the Pearson correlation coefficient corresponding to the target phase;

Return to execute the step of selecting one phase from the set of phases as the target phase, until the Pearson correlation coefficients for all phases in the distribution network have been calculated.

Optionally, the step of determining the target fault phase based on the Pearson correlation coefficient includes:

Establishing the relationship between the Pearson correlation coefficients for each phase and a predetermined coefficient threshold;

If the Pearson correlation coefficient is less than the predetermined coefficient threshold, designating the phase corresponding to the Pearson correlation coefficient as the target fault phase;

If the Pearson correlation coefficient is greater than the predetermined coefficient threshold, classifying the phase corresponding to the Pearson correlation coefficient as a normal phase.

Optionally, following the step of establishing the relationship between the Pearson correlation coefficients for each phase and the predetermined coefficient threshold, it also includes:

If all Pearson correlation coefficients are greater than the predetermined coefficient threshold, determining that a bus fault has occurred.

Optionally, before the step of obtaining the measured phase current transient variation and virtual phase current transient variation for each phase in the distribution network, the method further includes:

Obtaining the neutral point voltage value and the bus voltage value in the distribution network;

Determining the fault voltage threshold based on the bus voltage value and a predetermined ratio coefficient;

Assessing whether the neutral point voltage value is greater than or equal to the fault voltage threshold;

If so, determining that a single-phase ground fault has occurred in the distribution network;

Otherwise, concluding that no single-phase ground fault has occurred in the distribution network.

Optionally, the step of adjusting the voltage of the target fault phase based on the neutral-to-ground voltage includes:

Obtaining the current voltage value of the target fault phase and determining the opposite value of the current voltage;

Adjusting the voltage of the target fault phase using a negative feedback control method, until the opposite value of the current voltage matches the neutral-to-ground voltage value.

In addition, to achieve the aforementioned objectives, the invention also provides a relay system, which includes:

Data Acquisition Module: This module is designed to acquire the measured phase current transient variations and virtual phase current transient variations for each phase in the distribution network, as well as the neutral-to-ground voltage and the current value output from the fault phase when the voltage of the target fault phase is set to zero.

Fault Discrimination Module: This module calculates the Pearson correlation coefficient between the measured phase current transient variations and the virtual phase current transient variations for each phase, and determines the target fault phase based on this Pearson correlation coefficient.

Closed-Loop Self-Healing Control Module: This module adjusts the voltage of the target fault phase based on the neutral-to-ground voltage and is responsible for compensating the neutral point of the distribution network with an injected current that satisfies the specified current value.

Optionally, the fault discrimination module further includes:

Pearson Correlation Coefficient Calculation Unit: This unit is used to calculate the Pearson correlation coefficient between the transient changes in the measured phase current and the transient changes in the virtual phase current for each phase.

Judgment Unit: This unit determines the relationship between the Pearson correlation coefficients of each phase and a predefined coefficient threshold. If the Pearson correlation coefficient is less than the predefined coefficient threshold, the corresponding phase is identified as the target fault phase. Conversely, if the Pearson correlation coefficient is greater than the predefined coefficient threshold, the corresponding phase is classified as a normal phase.

Optionally, the relay system also includes a protection activation module, which comprises:

Voltage Acquisition Unit: This unit is responsible for obtaining the neutral point voltage and bus voltage values in the distribution network.

Voltage Threshold Calculation Unit: This unit determines the fault voltage threshold based on the bus voltage value and a predefined scaling factor, and checks whether the neutral point voltage is greater than or equal to the fault voltage threshold.

Fault Judgment Unit: If the neutral point voltage is greater than or equal to the fault voltage threshold, this unit determines that a ground fault has occurred in the distribution network; otherwise, it concludes that there is no single-phase ground fault in the distribution network.

Additionally, to achieve the aforementioned objectives, the invention also provides a computer-readable storage medium, on which a distribution network fault suppression program based on closed-loop self-healing control is stored. When executed by a processor, this closed-loop self-healing control-based fault suppression program implements the steps of the closed-loop self-healing control-based fault suppression method described above.

The embodiment of the present invention provides a closed-loop self-healing control-based method, system, and medium for distribution network fault suppression. By calculating the Pearson correlation coefficient between the transient changes in the measured phase current and the transient changes in the virtual phase current, the method performs fault phase selection based on the Pearson correlation coefficient. Subsequently, compensation current is injected into the selected fault phase using a closed-loop self-healing control approach, thereby driving the ground current and fault phase voltage of the distribution network to zero, ensuring the safe and reliable operation of the distribution network.

Figure 1:
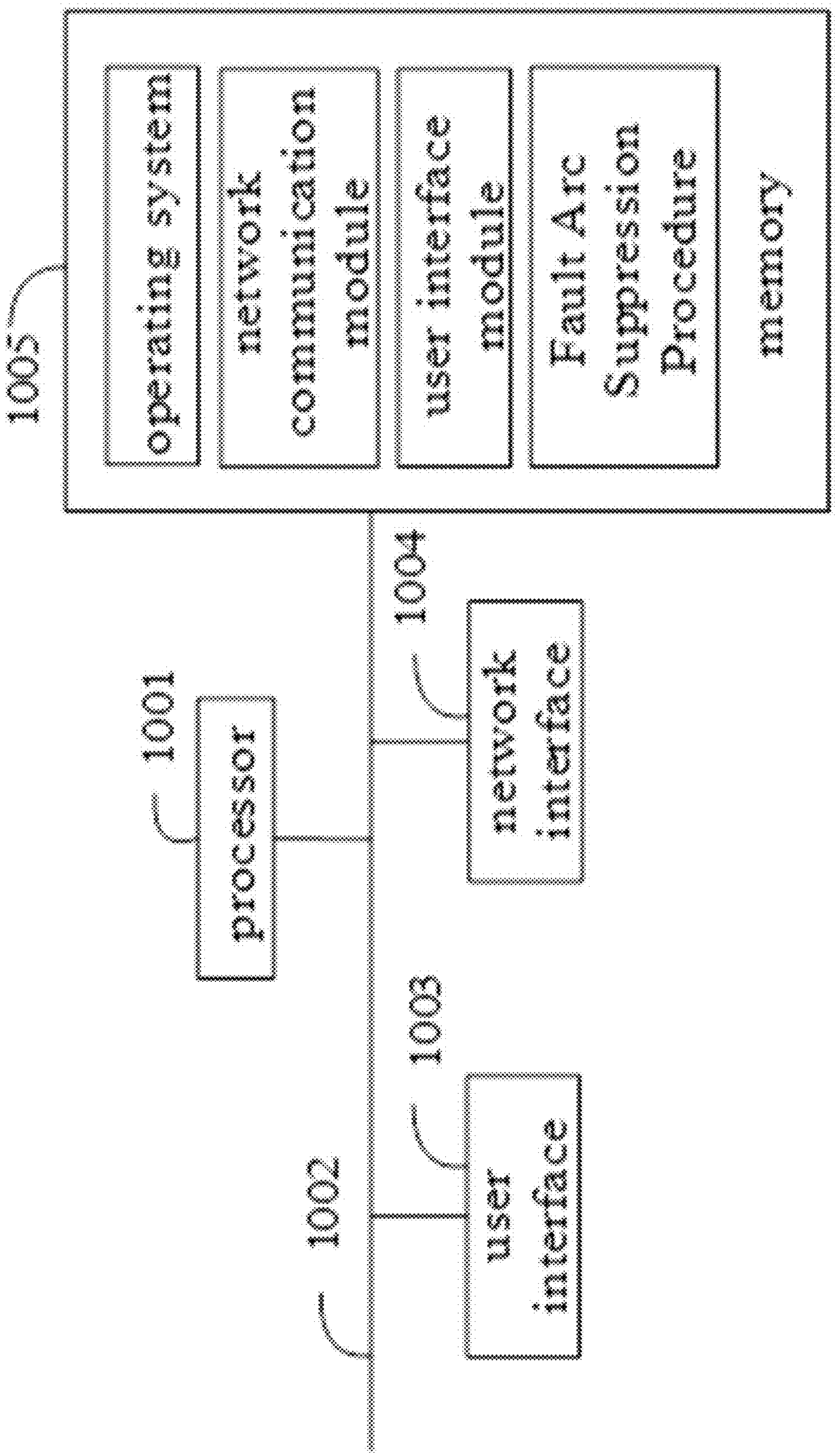
FIG. 1: A schematic diagram of the hardware operating environment of the relay system involved in the embodiment of the present invention.

The realization, functional characteristics, and advantages of the present invention will be further illustrated in conjunction with the embodiments and with reference to the accompanying drawings.

DETAILED DESCRIPTION OF THE INVENTION

Most of the distribution networks in our country are still located in mountainous and hilly areas, which leads to frequent faults caused by trees, primarily high-resistance faults. Additionally, due to the characteristics of the distribution network, a single-phase grounding fault can still allow the system to operate for 1-2 hours. Furthermore, the presence of line capacitance allows the capacitive current during a fault to discharge through the capacitance to ground, which can generate arcs over extended periods. This can potentially lead to wildfires and damage to electrical equipment. Therefore, it is essential to employ suppression devices to reduce the current at the fault point, preventing arcs caused by fault currents from triggering further disasters.

With the rapid development of the power system, particularly the expansion of distribution networks, the increasing proportion of urban cable installations, and the widespread use of various power electronic devices, the harmonic and active components of fault currents in distribution networks have become larger. This situation has led to grounding fault currents exceeding the safety threshold of 5 A. Although measures have been taken regarding the capacitive currents mentioned above, issues related to the compensation of active currents remain prominent, which can cause arcs to reignite and lead to more permanent faults across multiple phases, thereby enlarging the fault scope. In response to these faults and operational conditions, both passive and active suppression devices are under significant research and development.

For capacitive reactive fault currents, there has been relatively mature development, primarily through changing the grounding method of the neutral point to effectively quench arcs caused by capacitive fault currents. The most common method involves grounding through an arc suppression coil, which is a variable inductance coil with a core and an air gap. The compensation current of the arc suppression coil can be adjusted in stages (discrete adjustment) or continuously (infinitely adjustable), with adjustment methods being manual or automatic. Automatic adjustments can take the form of preset adjustments made prior to a grounding fault and immediate adjustments made after the fault occurs. In our country's compensation systems, although manual stage-adjustable arc suppression coils are prevalent, automatic tracking and tuning compensation devices are rapidly developing and have been extensively deployed.

Presently, the methods for arc suppression in distribution networks, based on the control objects, can be categorized into voltage-based suppression and current-based suppression. Voltage-based suppression involves bringing the fault phase voltage to zero, while current-based suppression entails reducing the fault current at the fault point to zero. Each method has its advantages and disadvantages: voltage-based suppression is more suitable for high-resistance grounding faults, but is less effective for metallic grounding faults; conversely, current-based suppression is appropriate for low-resistance faults, but less effective for high-resistance faults, and it is often used in conjunction with active converters, which can be costly.

To address different fault conditions, this application proposes a method that, upon the occurrence of a fault in the distribution network, calculates the Pearson correlation coefficient between the transient changes of the measured phase current and the virtual phase current. Based on the Pearson correlation coefficient, the method selects the faulted phase and subsequently injects compensation current into the selected faulted phase using a closed-loop self-healing control approach. This process aims to bring the ground current of the distribution network and the voltage of the faulted phase to zero, thereby ensuring the safe and reliable operation of the distribution network.

To enhance the understanding of the aforementioned technical solution, the exemplary embodiments of the present disclosure will be described in greater detail with reference to the accompanying drawings. While the drawings illustrate the exemplary embodiments of the present disclosure, it should be understood that various forms of the present disclosure can be realized and should not be limited to the embodiments described herein. Rather, these embodiments are provided to facilitate a more thorough understanding of the present disclosure and to fully convey the scope of the present disclosure to those skilled in the art.

As an implementation scheme, FIG. 1 is a schematic diagram of the hardware operating environment architecture of the relay system related to the embodiment of the present invention.

As shown in FIG. 1, the relay system may include: a processor 1001, such as a CPU; a memory 1005; a user interface 1003; a network interface 1004; and a communication bus 1002. The communication bus 1002 facilitates the connection and communication between these components. The user interface 1003 may include a display, an input unit such as a keyboard, and may optionally include standard wired and wireless interfaces. The network interface 1004 may also optionally include standard wired interfaces and wireless interfaces (such as a Wi-Fi interface). The memory 1005 may be high-speed RAM or non-volatile memory, such as disk storage. Additionally, memory 1005 may be an independent storage device that is separate from the aforementioned processor 1001.

Those skilled in the art will understand that the architecture of the relay system shown in FIG. 1 is not intended to limit the relay system and may include more or fewer components than illustrated, or combinations of certain components, or different component arrangements.

As illustrated in FIG. 1, the memory 1005, as a storage medium, may include an operating system, a network communication module, a user interface module, and a distribution network fault suppression program based on closed-loop self-healing control. The operating system manages and controls the hardware and software resources of the relay system, facilitating the execution of the closed-loop self-healing control distribution network fault suppression program and other software or applications.

In the relay system depicted in FIG. 1, the user interface 1003 is primarily used for connecting to terminals and facilitating data communication with those terminals. The network interface 1004 is mainly used for communication with the backend server. The processor 1001 can be utilized to invoke the closed-loop self-healing control distribution network fault suppression program stored in memory 1005.

In this embodiment, the relay system includes: a memory 1005, a processor 1001, and a distribution network fault suppression program based on closed-loop self-healing control stored in the memory and executable on the processor.

The operations performed by the processor 1001 when invoking the closed-loop self-healing control distribution network fault suppression program stored in memory 1005 are as follows:

Upon detecting a fault in the distribution network, the processor retrieves the actual phase current transient variation and the virtual phase current transient variation for each phase in the distribution network.

It then calculates the Pearson correlation coefficient between the actual phase current transient variation and the virtual phase current transient variation for each phase, determining the target fault phase based on this coefficient.

Next, the processor obtains the neutral-to-ground voltage value and adjusts the voltage of the target fault phase based on this value to bring the voltage of the target fault phase to zero.

Additionally, it retrieves the current output value from the fault phase when its voltage is set to zero and compensates the neutral point of the distribution network with an injection current that matches this current value, ensuring that both the ground fault current and the voltage of the fault phase in the distribution network are brought to zero.

When the processor 1001 invokes the arc suppression program for the distribution network fault based on closed-loop self-healing control stored in the memory 1005, the following operations are performed:

Calculate the standard deviation corresponding to the transient variation of the measured phase current for each phase, referred to as the first standard deviation.

Calculate the standard deviation corresponding to the transient variation of the virtual phase current for each phase, referred to as the second standard deviation.

Compute the mean difference between the transient variations of the measured phase current and the virtual phase current for each phase.

Obtain the number of samples.

Select one phase from the phases as the target phase, where the transient variation of the measured phase current for the target phase is designated as the target measured phase current transient variation, and the transient variation of the virtual phase current for the target phase is designated as the target virtual phase current transient variation.

Determine the Pearson correlation coefficient corresponding to the target phase based on the number of samples, the first standard deviation, the second standard deviation, the mean difference, the target measured phase current transient variation, and the target virtual phase current transient variation.

Return to the step of selecting one phase as the target phase until the Pearson correlation coefficients for all phases in the distribution network are calculated.

When the processor 1001 invokes the closed-loop self-healing control-based arc suppression program for the distribution network stored in memory 1005, the following operations are executed:

Determine the relationship between the Pearson correlation coefficients of each phase and the preset coefficient threshold.

If the Pearson correlation coefficient is less than the preset coefficient threshold, identify the corresponding phase of the Pearson correlation coefficient as the target fault phase.

If the Pearson correlation coefficient is greater than the preset coefficient threshold, classify the corresponding phase of the Pearson correlation coefficient as a normal phase.

When the processor 1001 invokes the closed-loop self-healing control-based arc suppression program for the distribution network stored in memory 1005, the following operation is executed:

If all the Pearson correlation coefficients are greater than the preset coefficient threshold, classify the situation as a bus fault.

When the processor 1001 invokes the closed-loop self-healing control-based arc suppression program for the distribution network stored in memory 1005, the following operations are executed:

Acquire the neutral point voltage value and the bus voltage value in the distribution network.

Based on the bus voltage value and a preset proportionality constant, determine the fault voltage threshold.

Assess whether the neutral point voltage value is greater than or equal to the fault voltage threshold.

If it is, classify the distribution network as experiencing a single-phase ground fault; otherwise, determine that the distribution network is not experiencing the single-phase ground fault.

When processor 1001 invokes the arc suppression program for distribution network faults stored in memory 1005 based on closed-loop self-healing control, the following operations are performed:

Acquire the current voltage value of the target fault phase and determine the opposite value of the current voltage.

Adjust the voltage of the target fault phase using a negative feedback regulation method until the opposite value of the current voltage matches the neutral point-to-ground voltage value.

Based on the hardware architecture of the relay protection system described above, this invention presents an embodiment of a fault arc suppression method for distribution networks based on closed-loop self-healing control.

First Embodiment

Figure 2:
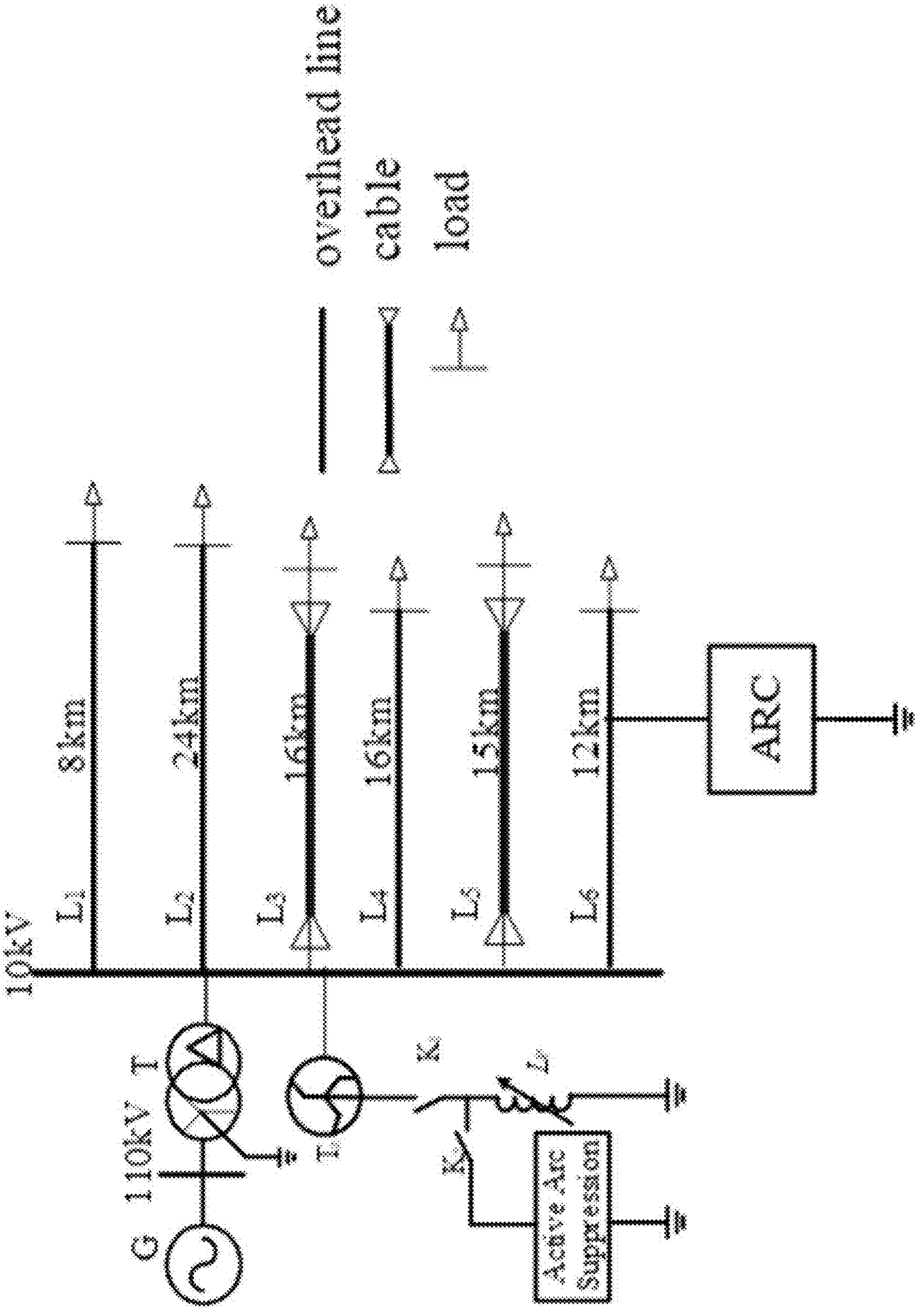
FIG. 2: A schematic diagram of the arc simulation model for the distribution network based on the actual operational setup of the distribution network involved in the embodiment of the present invention.

Referencing FIG. 2, which illustrates a schematic of an arc simulation model constructed from the actual operation of the distribution network, a simulation model of the distribution network is established using PSCAD/EMTDC as shown in FIG. 2. The substation operates at 110 kV/10 kV and has a total of six outgoing lines. There are four overhead lines: L1=20 km, L2=24 km, L4=16 km, and L6=12 km, along with two pure cable lines: L3=16 km and L5=15 km. The positive sequence impedance for the overhead lines is as follows: R1=0.45 Ω/km, L1=1.172 mH/km, C1=6.1 nF/km; the zero-sequence impedance is: R0=0.7 Ω/km, L0=3.91 mH/km, C0=3.8 nF/km. The positive sequence impedance for the cable feeders is: R1=0.075 Ω/km, L1=0.254 mH/km, C1=318 nF/km, while the zero-sequence impedance is: R0=0.102 Ω/km, L0=0.892 mH/km, C0=212 nF/km. The neutral point of the relay system is grounded via an arc suppression coil, and a single-phase ground fault is set in the simulation model. The fault point is located 10 km from the beginning of bus L1, with an initial fault angle of 90° and a transition resistance of 0.01Ω.

Figure 3:
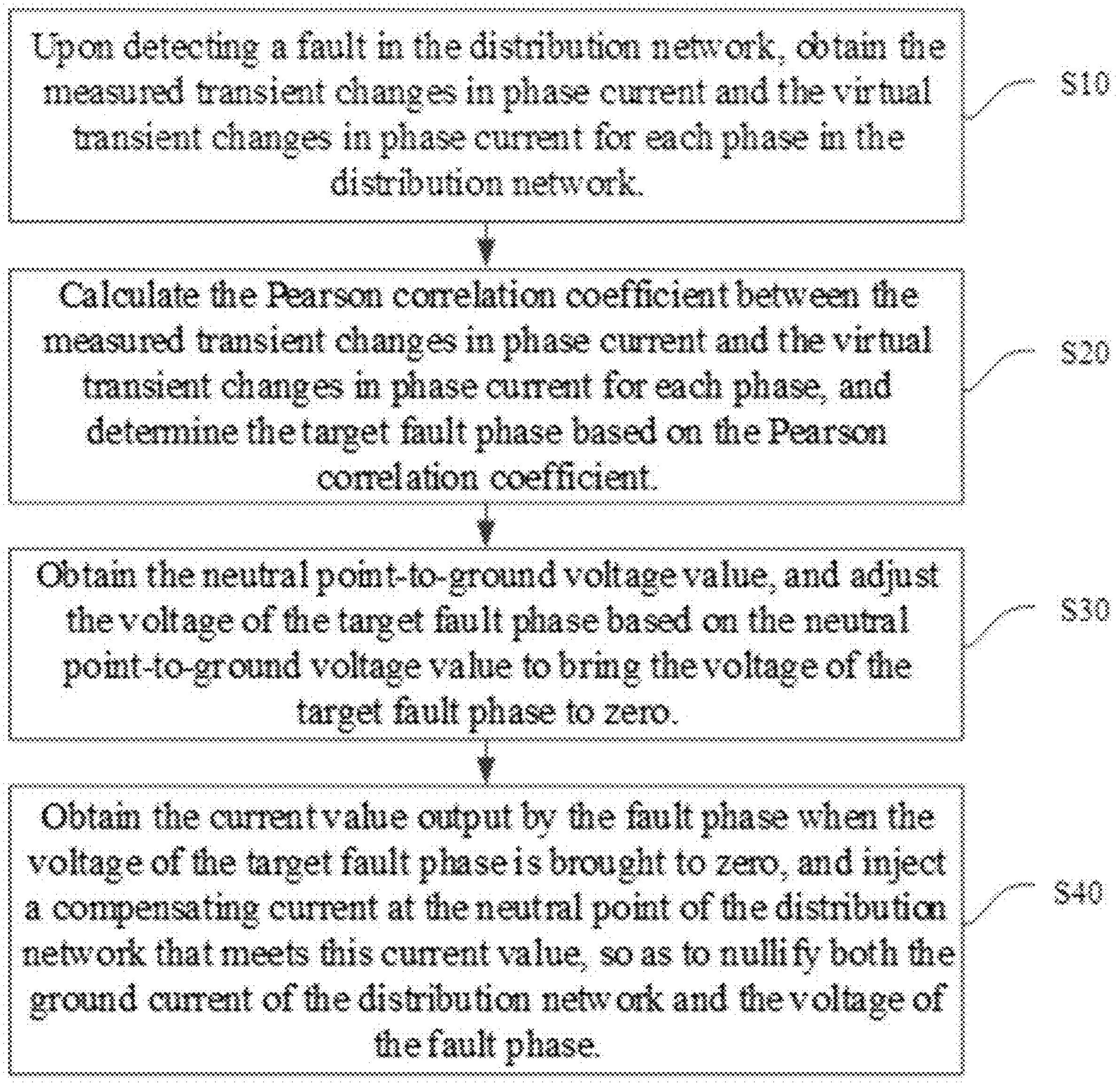
FIG. 3: A flow diagram of the first embodiment of the closed-loop self-healing control-based fault suppression method for the distribution network.

Referring to FIG. 3, in the first embodiment, the fault suppression method for the distribution network based on closed-loop self-healing control includes the following steps:

Step S10: Upon detecting a fault in the distribution network, obtain the measured transient variations of phase currents and the virtual transient variations of phase currents for each phase in the distribution network.

In this embodiment, the relay system continuously monitors the distribution network. When a fault occurs, the relay system captures the measured transient variations of phase currents and the virtual transient variations of phase currents in the distribution network.

The transient variation of phase current refers to the instantaneous increase in current during a fault in the distribution network. In this embodiment, the measured transient variation of phase current is the variation captured by the relay system, while the virtual transient variation of phase current is computed through system simulation.

Optionally, the measured transient variation of phase current can be obtained by installing current sensors at corresponding locations within the circuit.

Alternatively, the virtual transient variation of phase current can be derived by constructing a mathematical model of the power system, simulating the corresponding transient events, and recording the current waveform of those transient events, which serves as the virtual transient variation of phase current.

It should be noted that in this embodiment, the role of the virtual transient variation of phase current is to serve as a reference value for comparison with the measured transient variation of phase current, thereby facilitating fault analysis based on the comparison results.

Step S20: Calculate the Pearson correlation coefficient between the measured transient phase current changes and the virtual transient phase current changes for each phase, and determine the target fault phase based on the Pearson correlation coefficient.

In this embodiment, after acquiring the measured phase current transient variation and the virtual phase current transient variation, the similarity between these two variations is assessed using the Pearson correlation coefficient as a phase selection criterion. Based on the magnitude of the Pearson correlation coefficient, the target fault phase within each phase of the distribution network is determined.

It is important to note that when the Pearson correlation coefficient is positive, it indicates a positive correlation between the two quantities. Under normal conditions, the range of the Pearson correlation coefficient between the measured phase current transient variation and the virtual phase current transient variation is (0, 1], which signifies a positive correlation between these two transient variations.

Step S30 involves acquiring the neutral point-to-ground voltage value. Based on this value, the voltage of the target fault phase is adjusted to bring it to zero.

Step S40 involves acquiring the current value output by the fault phase when its voltage is set to zero. An injection current is then compensated to the neutral point of the distribution network to match this current value, thereby ensuring that both the ground current of the distribution network and the fault phase voltage are set to zero.

In this embodiment, a closed-loop self-healing control method is employed to suppress arcing on the faulted phase of the distribution network after identifying the target faulted phase. The relay system acquires voltage measurements from Voltage Transformers (VT) or voltage measuring devices to assess the voltage value of the neutral point relative to ground within the power system. The control device compares the measured voltage of the faulted phase with zero voltage, subsequently issuing a control signal to regulate the voltage of the faulted phase by automatically disconnecting or adjusting the operating state of circuit components, thereby driving the voltage of the target faulted phase to zero.

Furthermore, the protective device of the relay system also monitors the faulted phase current and records the current value when the faulted phase voltage is successfully adjusted to zero. A current that meets this recorded value is then injected into the faulted phase to counteract any residual current, maintaining the grounding current near zero to complete the arcing suppression.

For illustrative purposes, considering a three-phase distribution network with phases A, B, and C, the equation for the neutral point injection current I using Kirchhoff's first law for the distribution network is as follows:

$$I = -E_A(Y_B + Y_C + Y_0) + E_B Y_B + E_C Y_C$$

Where, YA, YB, and YC represent the ground admittances for phases A, B, and C, respectively; Y0 denotes the ground admittance of the neutral point; and EA, EB, and EC correspond to the source voltages of phases A, B, and C, respectively.

Where, the expressions for YA, YB, and YC are as follows:

$$Y_A = \frac{1}{R_A} + jwC_A$$

$$Y_A = \frac{1}{R_A} + jwC_A$$

$$Y_B = \frac{1}{R_B} + jwC_B$$

Where, RA, RB, and RC represent the grounding resistances for phases A, B, and C, respectively, and w denotes the angular frequency of the voltage.

In the technical solution provided in this embodiment, when a fault occurs in the distribution network, the Pearson correlation coefficient between the measured phase current transient variation and the virtual phase current transient variation is calculated. Based on the Pearson correlation coefficient, the faulted phase is identified. Subsequently, a compensating injection current is applied to the selected faulted phase using a closed-loop self-healing control method, ensuring that both the grounding current of the distribution network and the voltage of the faulted phase are driven to zero, thereby ensuring the safe and reliable operation of the distribution network.

Further, in this embodiment, step S20 includes:

Step S21: Calculate the standard deviation corresponding to the measured phase current transient variation for each phase, denoted as the first standard deviation; calculate the standard deviation corresponding to the virtual phase current transient variation for each phase, denoted as the second standard deviation; and compute the mean deviation between the measured phase current transient variation and the virtual phase current transient variation for each phase.

Step S22: Acquire the number of samples.

Step S23: Select one phase from each phase as the target phase, where the measured phase current transient variation corresponding to the target phase is referred to as the target measured phase current transient variation, and the virtual phase current transient variation corresponding to the target phase is referred to as the target virtual phase current transient variation.

Step S24: Based on the number of samples, the first standard deviation, the second standard deviation, the mean deviation, the target measured phase current transient variation, and the target virtual phase current transient variation, determine the Pearson correlation coefficient corresponding to the target phase.

Step S25: Return to execute the step of selecting one phase from each phase as the target phase until the Pearson correlation coefficients for all phases in the distribution network have been calculated.

Optionally, regarding the calculation of the Pearson correlation coefficient between the measured phase current transient variation and the virtual phase current transient variation:

For example, let the measured phase current transient variation be denoted as xi, the virtual phase current transient variation as yi, where i represents the phase number and n denotes the number of samples. The mean deviation between xi and xi is represented as $\overline{xy}$, while sx and sy are the standard deviations of x and y, respectively. The expression for the Pearson correlation coefficient p (x,y) is given by.

$$\rho(x, y) = \frac{\sum x_i y_i - n\overline{xy}}{(n-1)s_x s_y} = \frac{n\sum x_i y_i - \sum x_i \sum y_i}{\sqrt{n\sum x_i^2 - (\sum x_i^2)}\sqrt{n\sum y_i^2 - (\sum y_i^2)}}$$

In this embodiment, the Pearson correlation coefficient is calculated for each phase in the distribution network. After determining the Pearson correlation coefficient between the measured phase current transient variation and the virtual phase current transient variation for each phase, the phase with the fault is identified based on the magnitude of the Pearson correlation coefficient for each phase.

Furthermore, in this embodiment, the steps for determining the target fault phase based on the Pearson correlation coefficient include:

Step S26: Determine the relationship between the Pearson correlation coefficient of each phase and the preset coefficient threshold.

Step S27: If the Pearson correlation coefficient is less than the preset coefficient threshold, identify the phase corresponding to the Pearson correlation coefficient as the target fault phase.

Step S28: If the Pearson correlation coefficient equals the preset coefficient threshold, determine that the phase corresponding to the Pearson correlation coefficient is a normal phase.

Optionally, in this embodiment, a preset coefficient threshold is established. When the Pearson correlation coefficient of a certain phase is less than the preset coefficient threshold, it indicates that there is a significant waveform difference between the measured phase current transient variation and the virtual phase current transient variation, thus identifying that phase as the fault phase. Conversely, when the Pearson correlation coefficient of a certain phase is greater than the preset coefficient threshold, it indicates a minor waveform difference between the measured and virtual phase current transient variations, classifying that phase as a normal phase.

Additionally, after step S26, the following step is included:

Step S29: If all Pearson correlation coefficients are greater than the preset coefficient threshold, this is determined as a bus fault.

In this embodiment, if all Pearson correlation coefficients are found to be greater than the preset coefficient threshold, it indicates that there is a fault in the bus of the distribution network.

Second Embodiment

Figure 4:
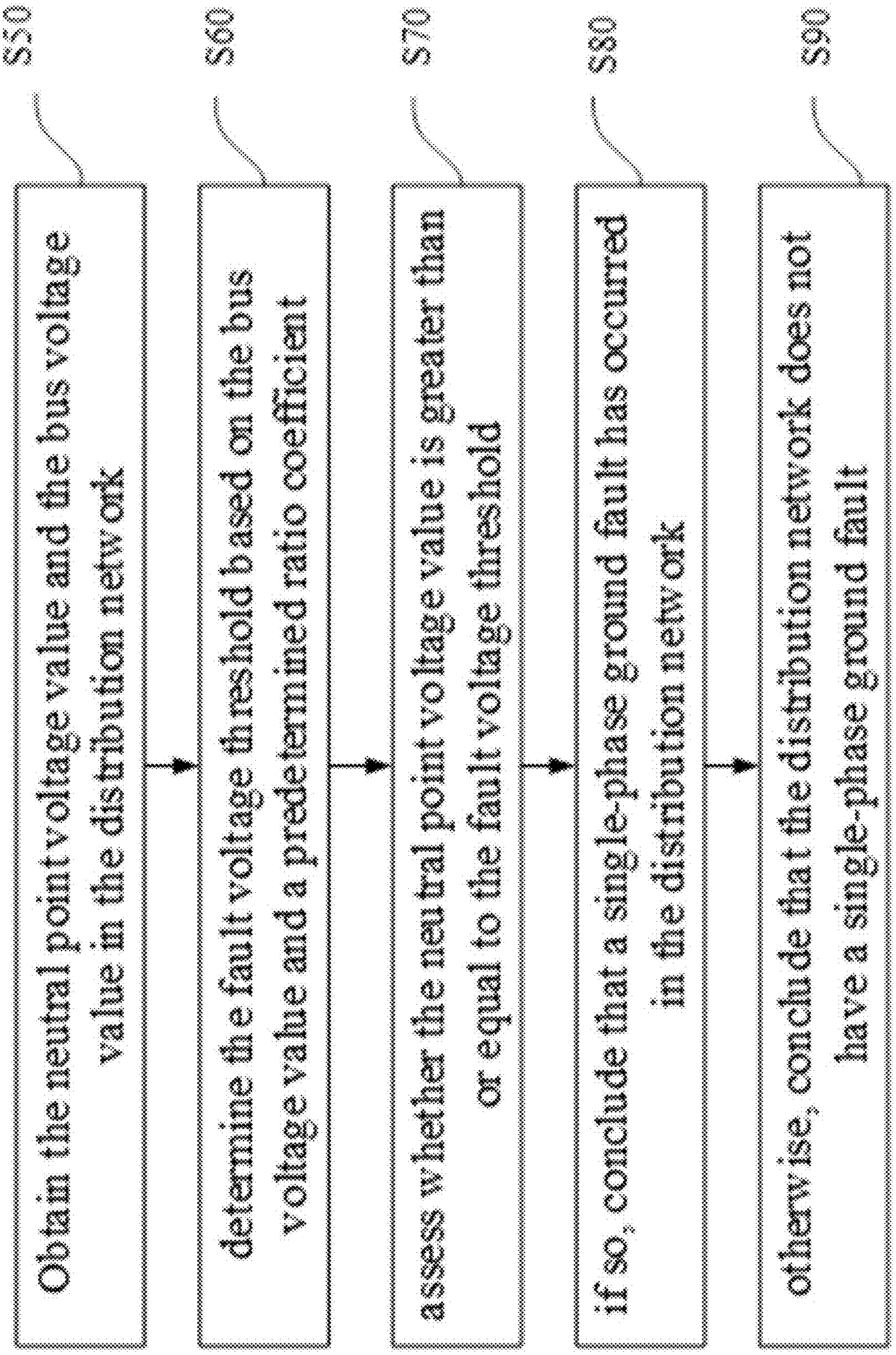
FIG. 4: A flow diagram of the second embodiment of the closed-loop self-healing control-based fault suppression method for the distribution network.

Referring to FIG. 4, based on the first embodiment, prior to step S10, the following steps are included:

Step S50: Acquire the neutral point voltage value and bus voltage value in the distribution network.

Step S60: Determine the fault voltage threshold based on the bus voltage value and a preset ratio coefficient.

Step S70: Assess whether the neutral point voltage value is greater than or equal to the fault voltage threshold.

Step S80: If so, determine that a single-phase ground fault has occurred in the distribution network.

Step S90: Otherwise, conclude that no single-phase ground fault has occurred in the distribution network.

As an optional implementation, the method for the relay system to detect faults in the distribution network is based on the neutral point voltage value and bus voltage value.

In this embodiment, the relay system collects the voltage at the bus using a voltage acquisition device to obtain the bus voltage value, which is used to determine the fault voltage threshold. The fault voltage threshold is calculated based on the bus voltage value and the preset ratio coefficient. Optionally, the fault voltage threshold is defined as: text{Fault Voltage Threshold=Bus Voltage Value*Preset Ratio Coefficient.

In this embodiment, after determining the fault voltage threshold, the relationship between the neutral point voltage and the fault voltage threshold is compared. If the neutral point voltage is greater than or equal to the fault voltage threshold, a single-phase ground fault in the distribution network is identified; otherwise, it is determined that no single-phase ground fault exists.

For instance, let the bus voltage be U0, the neutral point voltage be Um, and the preset proportional coefficient be 15%. If U0>15%*Um, a single-phase ground fault occurs; if U0<15%*Um, no single-phase ground fault occurs.

In the technical solution provided by this embodiment, real-time measurements of the neutral point voltage, bus voltage, and the preset proportional coefficient are utilized to determine whether a single-phase ground fault has occurred in the distribution network. This ensures timely detection of single-phase ground faults, which serves as a prerequisite for the implementation of subsequent suppression strategies, thereby ensuring the safe and reliable operation of the distribution network.

Figure 5:
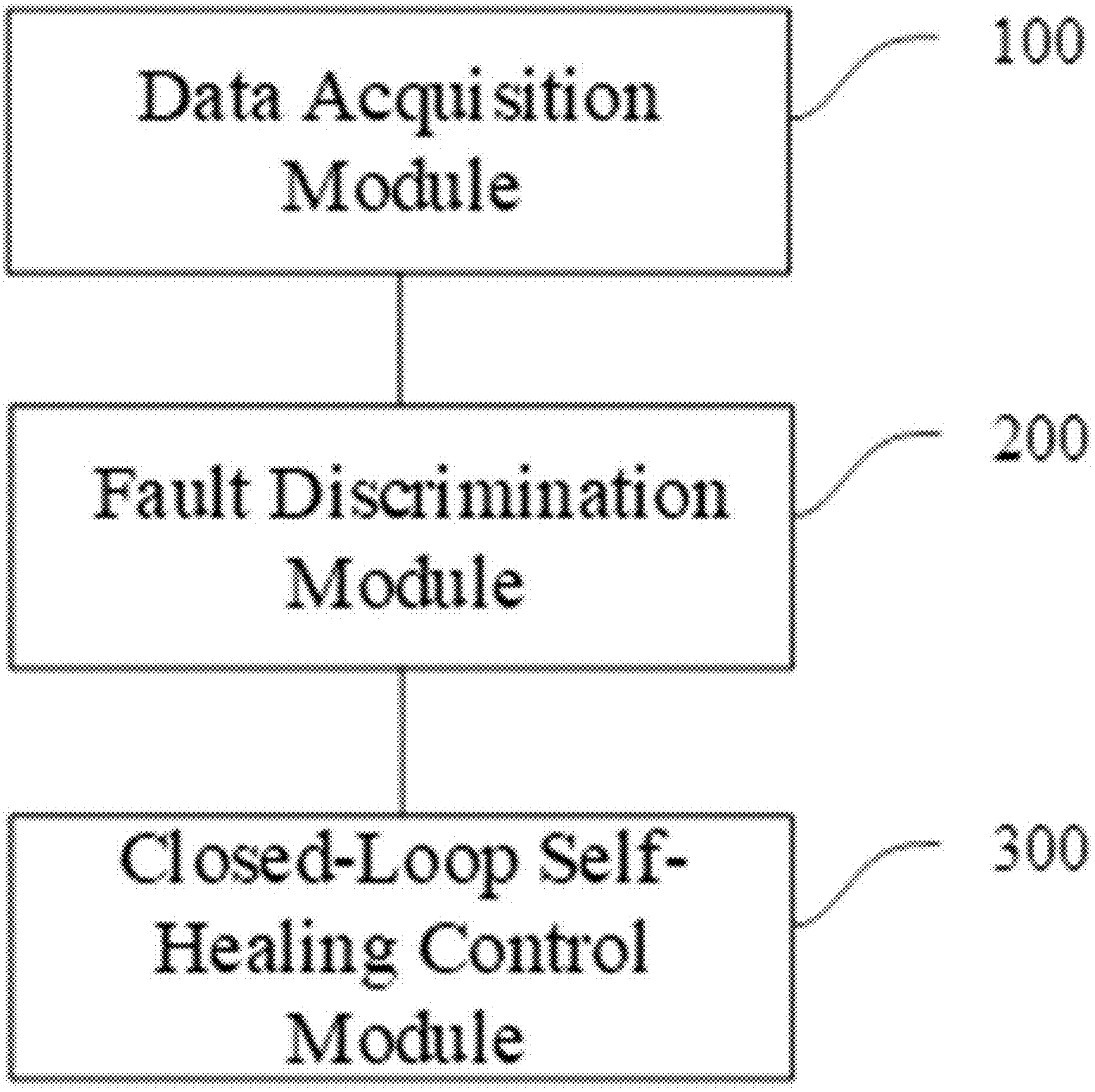
FIG. 5: A schematic diagram of the architecture of the relay system involved in the embodiment of the present invention.

Based on FIG. 5, this embodiment also proposes a relay system architecture, which includes:

Data Acquisition Module 100: This module is responsible for collecting the measured phase current transient variations and virtual phase current transient variations for each phase in the distribution network, as well as the neutral point-to-ground voltage and the current value output by the faulted phase when the voltage of the target faulted phase is set to zero.

Fault Discrimination Module 200: This module calculates the Pearson correlation coefficient between the measured phase current transient variations and the virtual phase current transient variations for each phase. It determines the target faulted phase based on the Pearson correlation coefficient.

Closed-loop Self-healing Control Module 300: This module adjusts the voltage of the target faulted phase based on the neutral point-to-ground voltage and compensates the neutral point of the distribution network with an injected current that meets the specified current value.

Additionally, the fault discrimination module includes:

Pearson Correlation Coefficient Calculation Unit: This unit calculates the Pearson correlation coefficient between the measured phase current transient variations and the virtual phase current transient variations for each phase.

Judgment Unit: This unit determines the relationship between the Pearson correlation coefficient for each phase and a preset coefficient threshold. If the Pearson correlation coefficient is less than the preset coefficient threshold, the phase corresponding to the Pearson correlation coefficient is identified as the target faulted phase. If the Pearson correlation coefficient is greater than the preset coefficient threshold, the phase corresponding to the Pearson correlation coefficient is considered a normal phase.

The relay system further comprises a protection startup module, which includes:

Voltage Acquisition Unit: This unit is used to acquire the neutral point voltage value and busbar voltage value within the distribution network.

Voltage Threshold Calculation Unit: This unit is responsible for determining the fault voltage threshold based on the busbar voltage value and a preset ratio coefficient, as well as assessing whether the neutral point voltage value is greater than or equal to the fault voltage threshold.

Fault Judgment Unit: This unit is utilized to ascertain if a grounding fault has occurred in the distribution network when the neutral point voltage value is greater than or equal to the fault voltage threshold; otherwise, it determines that there is no single-phase grounding fault in the distribution network.

Furthermore, it is understood by those skilled in the art that all or part of the processes in the method of the above implementation can be executed via computer programs that instruct the relevant hardware. This computer program includes program instructions and can be stored on a storage medium, which is a computer-readable storage medium. The program instructions are executed by at least one processor in the relay system to implement the process steps of the method described in the above implementation.

Thus, the present invention also provides a computer-readable storage medium, which stores a fault suppression program for the distribution network based on closed-loop self-healing control. When executed by a processor, this program implements the various steps of the fault suppression method based on closed-loop self-healing control as described in the above implementation.

The computer-readable storage medium may include various types such as USB drives, external hard drives, Read-Only Memory (ROM), magnetic disks, or optical discs, which can store program code.

It should be noted that the storage medium provided in the embodiments of this application is utilized for implementing the methods described herein. Therefore, based on the methods outlined in this application, those skilled in the art can understand the specific structure and variations of the storage medium; thus, further elaboration is unnecessary. Any storage medium employed in the methods of this application falls within the scope of protection sought by this application.

Technicians in the field should understand that the embodiments of this invention may be presented as methods, systems, or computer program products. Consequently, the invention can be realized in a fully hardware embodiment, a fully software embodiment, or a combination of both software and hardware embodiments. Additionally, the invention may be embodied in the form of a computer program product implemented on one or more computer-readable storage media containing computer-executable program code (including but not limited to magnetic disk storage, CD-ROMs, optical storage, etc.).

This invention is described with reference to flowcharts and/or block diagrams depicting the methods, devices (systems), and computer program products according to the embodiments of this invention. It should be understood that each process and/or block in the flowcharts and/or block diagrams can be realized by computer program instructions. These computer program instructions may be provided to a general-purpose computer, a dedicated computer, an embedded processor, or other programmable data processing devices to produce a machine, such that the instructions executed by the processor of the computer or other programmable data processing devices create a means for implementing the functions specified in one or more processes of the flowchart and/or one or more blocks of the block diagrams.

These computer program instructions may also be stored in a computer-readable storage medium that directs a computer or other programmable data processing device to operate in a specific manner, such that the instructions stored in the computer-readable storage medium produce an instruction apparatus that implements the functions specified in one or more processes of a flowchart and/or one or more blocks of a block diagram.

These computer program instructions may also be loaded onto a computer or other programmable data processing device, enabling a series of operational steps to be executed on the computer or other programmable device to produce a computer-implemented process, thereby providing steps for executing the instructions on the computer or other programmable device that realize the functions specified in one or more processes of a flowchart and/or one or more blocks of a block diagram.

It should be noted that any reference numerals in parentheses should not be construed as limiting the claims. The term "comprising" does not exclude the presence of components or steps not expressly listed in the claims. The terms "a" or "an" preceding a component do not preclude the existence of a plurality of such components. The invention may be realized through hardware comprising several different components as well as through appropriately programmed computers. In the case of unit claims listing several devices, multiple instances of those devices may be embodied by a single hardware item. The use of terms such as first, second, and third does not imply any order; these terms may be interpreted as labels.

Although preferred embodiments of the invention have been described, those skilled in the art may make additional changes and modifications upon understanding the fundamental inventive concepts. Therefore, the appended claims are intended to be interpreted to include the preferred embodiments and all modifications and variations falling within the scope of the invention.

Clearly, those skilled in the art may make various alterations and modifications to the invention without departing from the spirit and scope of the invention. Thus, if such modifications and variations of the invention fall within the scope of the claims and their equivalents, the invention is also intended to encompass such changes and modifications.

What is claimed is:

1. A method for fault arc suppression in distribution networks based on closed-loop self-healing control, characterized in that the method comprises the following steps:

upon detecting a fault in the distribution network, the transient changes in the measured phase current and virtual phase current of each phase are obtained;

the Pearson correlation coefficient between the transient changes of the measured phase current and the virtual phase current for each phase is calculated, and the target fault phase is determined based on this Pearson correlation coefficient;

the neutral point-to-ground voltage value is retrieved, and the voltage of the target fault phase is adjusted based on this value to bring the voltage of the target fault phase to zero;

the current value output from the fault phase when its voltage is zeroed is obtained, and an injected current that satisfies this current value is compensated at the neutral point of the distribution network to ensure that both the ground fault current and the voltage of the fault phase are brought to zero.

2. The method according to claim 1, characterized in that the steps for calculating the Pearson correlation coefficient between the transient changes of the measured phase current and the virtual phase current for each phase include:

calculating the standard deviation corresponding to the transient change of the measured phase current for each phase, referred to as the first standard deviation;

calculating the standard deviation corresponding to the transient change of the virtual phase current for each phase, referred to as the second standard deviation;

calculating the mean difference between the transient changes of the measured phase current and the virtual phase current for each phase;

obtaining the number of samples;

selecting one phase from the phases as the target phase, where the transient change of the measured phase current for the target phase is referred to as the target measured phase current transient change, and the transient change of the virtual phase current for the target phase is referred to as the target virtual phase current transient change;

determining the Pearson correlation coefficient corresponding to the target phase based on the number of samples, the first standard deviation, the second standard deviation, the mean difference, the target measured phase current transient change, and the target virtual phase current transient change;

returning to the step of selecting one phase as the target phase until the Pearson correlation coefficients for all phases in the distribution network have been calculated.

3. The method according to claim 1, characterized in that the step of determining the target fault phase based on the Pearson correlation coefficient includes:

determining the relationship between the Pearson correlation coefficients of each phase and a preset coefficient threshold;

if the Pearson correlation coefficient is less than the preset coefficient threshold, identifying the phase corresponding to the Pearson correlation coefficient as the target fault phase;

if the Pearson correlation coefficient is greater than the preset coefficient threshold, determining that the phase corresponding to the Pearson correlation coefficient is a normal phase.

4. The method according to claim 3, characterized in that, after the step of determining the relationship between the Pearson correlation coefficients of each phase and the preset coefficient threshold, it further includes:

if the Pearson correlation coefficients are all greater than the preset coefficient threshold, determining a bus fault.

5. The method according to claim 1, characterized in that prior to the step of acquiring the measured transient change of phase current and the virtual transient change of phase current in the distribution network, it further includes:

acquiring the neutral point voltage value and the bus voltage value in the distribution network;

determining the fault voltage threshold based on the bus voltage value and a preset proportional coefficient;

determining whether the neutral point voltage value is greater than or equal to the fault voltage threshold;

if so, determining that a single-phase grounding fault has occurred in the distribution network;

otherwise, determining that no single-phase grounding fault has occurred in the distribution network.

6. The method as claimed in claim 1, characterized in that the step of regulating the voltage of the target fault phase based on the neutral point to ground voltage includes:

obtaining the current voltage value of the target fault phase and determining the negation of the current voltage value;

regulating the voltage of the target fault phase based on a negative feedback adjustment approach until the negation of the current voltage value equals the neutral point to ground voltage value.

7. A relay system characterized by its application of the method as claimed in claim 1, wherein the relay system comprises:

a data acquisition module for obtaining the measured transient change of phase currents in the distribution network, the virtual transient change of phase currents, the neutral point to ground voltage, and the current value output by the fault phase when the voltage of the target fault phase is zeroed;

a fault discrimination module for calculating the Pearson correlation coefficient between the measured transient changes of phase currents and the virtual transient changes of phase currents, and for determining the target fault phase based on the Pearson correlation coefficient;

a closed-loop self-healing control module for regulating the voltage of the target fault phase based on the neutral point to ground voltage and for compensating the neutral point of the distribution network with an injected current that meets the specified current value.

8. The relay system as described in claim 7, characterized in that the fault discrimination module further comprises:

a Pearson correlation coefficient calculation unit for calculating the Pearson correlation coefficient between the measured phase current transient variations and the virtual phase current transient variations for each phase;

a determination unit for establishing the relationship between the Pearson correlation coefficients for each phase and a predetermined coefficient threshold; if the Pearson correlation coefficient is less than the predetermined coefficient threshold, the corresponding phase of the Pearson correlation coefficient is identified as the target fault phase; if the Pearson correlation coefficient is greater than the predetermined coefficient threshold, the corresponding phase of the Pearson correlation coefficient is classified as a normal phase.

9. The relay system as described in claim 7, characterized in that the relay system further comprises a protection initiation module, which includes:

a voltage acquisition unit for obtaining the neutral point voltage value and the bus voltage value in the distribution network;

a voltage threshold calculation unit for determining the fault voltage threshold based on the bus voltage value and a predetermined proportional coefficient, as well as assessing whether the neutral point voltage value is greater than or equal to the fault voltage threshold;

a fault judgment unit that determines whether a ground fault has occurred in the distribution network if the neutral point voltage value is greater than or equal to the fault voltage threshold; otherwise, it determines that no single-phase ground fault has occurred in the distribution network.

10. A computer-readable storage medium, characterized in that it stores a distribution network fault suppression program based on closed-loop self-healing control, wherein the closed-loop self-healing control-based distribution network fault suppression program executes the steps of the closed-loop self-healing control-based distribution network fault suppression method as described in claim 1 when processed by a processor.

* * * * *